US011482635B2

(12) United States Patent
Liu et al.

(10) Patent No.: US 11,482,635 B2
(45) Date of Patent: Oct. 25, 2022

(54) INGAN SOLAR PHOTOVOLTAIC DEVICE WITH FLEXIBLE MULTI-LAYER STRUCTURE AND METHOD FOR MANUFACTURING THE SAME

(71) Applicant: HUBEI YUBOND TECHNOLOGY CO., LTD., Wuhan (CN)

(72) Inventors: Ping Liu, Wuhan (CN); Dan Liu, Wuhan (CN)

(73) Assignee: HUBEI YUBOND TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/121,720

(22) Filed: Dec. 14, 2020

(65) Prior Publication Data
US 2021/0202776 A1    Jul. 1, 2021

(30) Foreign Application Priority Data
Dec. 27, 2019  (CN) .......................... 201911378053.6

(51) Int. Cl.
*H01L 31/0693*    (2012.01)
*H01L 31/0216*    (2014.01)
(Continued)

(52) U.S. Cl.
CPC .... *H01L 31/0693* (2013.01); *H01L 31/02168* (2013.01); *H01L 31/03042* (2013.01);
(Continued)

(58) Field of Classification Search
CPC ...................... H01L 31/03048; H01L 31/1848
See application file for complete search history.

(56) References Cited

U.S. PATENT DOCUMENTS 9,373,734 B1 * 6/2016 Daly .................. H01L 31/03048
2002/0024981 A1 * 2/2002 Tojo ........................ H01S 5/028
372/45.01
(Continued)

FOREIGN PATENT DOCUMENTS

CN    101101933 A    1/2008
CN    102254964 A    11/2011
(Continued)

OTHER PUBLICATIONS

Liu, et al., Transactions of Tianjin University, 2017, vol. 23, pp. 420-426 (Year: 2017).*
(Continued)

*Primary Examiner* — Sadie White
(74) *Attorney, Agent, or Firm* — Winston Hsu

(57) ABSTRACT

An InGaN solar photovoltaic device includes a base band, a light absorption layer, an n-type ZnO electron transport layer, and a p-type InN hole transport layer, the p-type InN hole transport layer is on a front side of the light absorption layer, and the base band and the n-type ZnO electron transport layer are on a back side of the light absorption layer, wherein the light absorption layer includes a p-type $In_xGa_{1-x}N$ layer and an n-type $In_yGa_{1-y}N$ layer which are superposed, where $0.2<x<0.4$ and $0.2<y<0.4$, and the p-type $In_xGa_{1-x}N$ layer and the n-type $In_yGa_{1-y}N$ layer are doped with Si and Mg. The InGaN solar photovoltaic device with a flexible multi-layer structure features high in energy conversion efficiency, low in cost, simple in manufacturing, and easy to implement, and thus has a broad prospect in application.

2 Claims, 2 Drawing Sheets

(51) Int. Cl.
*H01L 31/0304* (2006.01)
*H01L 31/0392* (2006.01)
*H01L 31/18* (2006.01)

(52) U.S. Cl.
CPC .. *H01L 31/03048* (2013.01); *H01L 31/03926* (2013.01); *H01L 31/1848* (2013.01); *H01L 31/1852* (2013.01)

(56) References Cited

U.S. PATENT DOCUMENTS

2006/0269787 A1* 11/2006 Chen ............... H01L 51/5092 428/690
2018/0097137 A1* 4/2018 Bedell ................. H01L 31/068

FOREIGN PATENT DOCUMENTS

| CN | 105470317 A | 4/2016 |
| CN | 106449851 A | 2/2017 |
| CN | 106549020 A | 3/2017 |
| CN | 106829930 | 9/2019 |
| CN | 109776826 | 9/2020 |

OTHER PUBLICATIONS

Shim, et al., Applied Physics Express, 2011, vol. 4, 052302 (Year: 2011).*
Chen, et al., Physical Status Solidi (a), 2008, vol. 205, No. 5, pp. 1103-1105 (Year: 2008).*
Rodrigues, et al., Journal of Applied Physics, 2007, vol. 102, 073714 (Year: 2007).*
Movla, et al., Applied Physics A, 2012, vol. 109, pp. 497-502 (Year: 2012).*
N. Miller et al., JWAger@lbl.gov, "Hole transport and photoluminescence in Mg-doped InN", APS/123-QED, Mar. 24, 2010, p. 1-20.
Liu Weifeng, "Theoretical and applied research on solar photovoltaic technology", Beijing Institute of Technology Press, cover page & p. 1-2 & p. 34-38, Apr. 2019.

* cited by examiner

INGAN SOLAR PHOTOVOLTAIC DEVICE WITH FLEXIBLE MULTI-LAYER STRUCTURE AND METHOD FOR MANUFACTURING THE SAME

CROSS REFERENCE TO RELATED APPLICATION

This application claims priority to CN patent application NO. 201911378053.6 filed on 2019 Dec. 27. The contents of the above-mentioned application are all hereby incorporated by reference.

BACKGROUND OF THE INVENTION

1. Field of the Invention

The invention relates to the technical field of semiconductor material devices, more particularly, to an InGaN solar photovoltaic device with a flexible multi-layer structure and a method for manufacturing the same.

2. Description of the Prior Art

In the context of continuous exacerbation of the global energy crisis and worsening of environmental problems, it is urgent to improve solar energy conversion efficiency, reduce environmental pollution, and develop renewable new energy sources. People showed an increased interest in flexible compound solar photovoltaic power generation with renewable, safe and clean energy sources. Moreover, more countries have developed and supported it as a major new energy source project, expanded the proportion of solar energy in the energy structure year by year, and strove for the dominant role of solar energy in the future energy structure. Solar energy is advantageous in photo-thermal, photo-electric, photo-chemical and photo-biological utilization, and has gradually unveiled its applications in new industries, new fields and new products.

In the field of aerospace, space stations and artificial earth satellites are primarily powered by solar cell systems. The power system is the most important part of the space detection system of a satellite, and it is reported that one of the key difficulties in technology to be overcome in future space detection is the energy system, which represents the ultimate limit to space stations and satellites, namely, the energy supply. Satellite communication and information processing require a great deal of energy, however, at present, the solar cells available for many countries in the aerospace application include mainly monocrystalline silicon and gallium arsenide solar cells, which feature low photoelectric conversion efficiency and reduced performance due to the weight of the material and fail still to meet the increasing demand of energy in space application.

As the research of III-V nitride semiconductor materials goes further, semiconductor materials of the ternary alloy system make it possible to manufacture more efficient multi junction solar power generation devices. InGaN is sensitive to the solar spectrum radiation from near-infrared light to ultraviolet, InGaN has an energy gap in almost perfect match with the solar spectrum, and a flexible compound solar photovoltaic power generation device made of the ternary alloy shows very high conversion efficiency. As theoretically calculated, the efficiency of the solar cell device can reach up to 50% when made of InGaN dual junction alloy, one junction has an energy gap of 1.1 ev, and the other junction has an energy gap of 1.7 ev. The efficiency of a triple junction (or multi-junction) InGaN photovoltaic device can reach up to 72% and more. However, InGaN solar photovoltaic devices have a problem of piezoelectric polarization, unable to form a good internal electric field. The conventional GaN lattice constant is 3.548 Å, while the InN lattice constant is 3.189 Å. A higher constituent of In leads to a closer InGaN lattice constant to that of InN, and worse piezoelectric polarization due to lattice mismatch. The actual conversion effect of the solar photovoltaic power generation device in the prior art is still in want of improvement.

SUMMARY OF THE INVENTION

It is a major object of the invention to overcome the defects in the prior art by providing an InGaN solar photovoltaic device with a flexible multi-layer structure and a method for manufacturing the same.

To achieve the above object, the invention implements the following technical solution.

An InGaN solar photovoltaic device with a flexible multi-layer structure, including a base band, a light absorption layer, an n-type ZnO electron transport layer, and a p-type InN hole transport layer, the p-type InN hole transport layer being on a front side of the light absorption layer, and the base band and the n-type ZnO electron transport layer being on a back side of the light absorption layer, wherein the light absorption layer includes a p-type $In_xGa_{1-x}N$ layer and an n-type $In_yGa_{1-y}N$ layer which are superposed, where $0.2<x<0.4$ and $0.2<y<0.4$, and the p-type $In_xGa_{1-x}N$ layer and the n-type $In_yGa_{1-y}N$ layer are doped with Si and Mg.

In further aspects, the p-type $In_xGa_{1-x}N$ layer and n-type $In_yGa_{1-y}N$ layer which are superposed have a thickness of not less than 800 nm.

Each of the p-type $In_xGa_{1-x}N$ layer and the n-type $In_yGa_{1-y}N$ layer each has a thickness of 400 nm.

The p-type InN hole transport layer has a thickness of 20 nm and a hole concentration of $4\times10^{18}$ cm$^{-3}$, the base band has a thickness of 15 μm, and the n-type ZnO layer electron transport layer has a thickness of 15 μm and an electron concentration of $8\times10^{18}$ cm$^{-3}$.

The base band is between the n-type ZnO electron transport layer and the light absorption layer, or the n-type ZnO electron transport layer is between the base band and the light absorption layer.

The device further includes an anti-reflective layer on a front side of the p-type InN hole transport layer.

The base band is a quantum carbon base band.

The base band is a graphene quantum carbon compound semiconductor.

A method for manufacturing the InGaN solar photovoltaic device with a flexible multi-layer structure, including:

forming a quantum carbon compound base band;

growing, on a front side of a quantum carbon compound baseband, a light absorption layer formed by superposing a p-type $In_xGa_{1-x}N$ layer/an n-type $In_yGa_{1-y}N$ layer, wherein the p-type $In_xGa_{1-x}N$ layer/the n-type $In_yGa_{1-y}N$ layer is doped with Si and Mg;

growing a p-type InN hole transport layer on a front side of the light absorption layer;

growing an n-type ZnO electron transport layer on a back side of the quantum carbon compound baseband; and growing a front electrode and a back electrode, respectively;

alternatively, forming a quantum carbon compound base band;

growing an n-type ZnO electron transport layer on a front side of the quantum carbon compound baseband;

growing, on a front side of the n-type ZnO electron transport layer, a light absorption layer formed by superposing a p-type $In_xGa_{1-x}N$ layer/an n-type $In_yGa_{1-y}N$ layer, wherein the p-type $In_xGa_{1-x}N$ layer/the n-type $In_yGa_{1-y}N$ layer is doped with Si and Mg;

growing a p-type InN hole transport layer on a front side of the light absorption layer; and growing a front electrode and a back electrode, respectively.

In further aspects, the p-type $In_xGa_{1-x}N$ layer and the n-type $In_yGa_{1-y}N$ layer are deposited through a MoCVD process featuring a vacuum degree of $3\times10^{-4}$ Pa, a revolving speed of 32 Hz, an $NH_3$ flow rate of 52 sccm, an operating pressure of 5.6 Tor, and are grown sequentially with Ga followed by In, where a Ga source is trimethylgallium (TmGa), an In source is trimethylindium (TmIn), an N source is ammonia gas ($NH_3$); when Ga is grown, the Ga source has a temperature of 23° C., a carrier gas $H_2$ has a flow rate 16 sccm, and the deposition on the base band lasts for 30-40 min at 800° C.; when In is grown, the In source has a temperature of 20° C., the carrier gas $H_2$ has a flow rate of 26 sccm, and the deposition on the base band lasts for 80-90 min at 600° C.; the Si dopant is sourced from silane, a carrier gas $H_2$ has a flow rate of 10-14 sccm, the deposition lasts for 40-60 min; the Mg dopant is sourced from magnesium dimocene, a carrier gas $H_2$ has a flow rate of 20-28 sccm, and the deposition lasts for 20-40 min.

The method further includes generating, on a front side of the p-type InN hole transport layer, an anti-reflective layer, where the front electrode is grown.

The invention has the following beneficial effects:

The invention provides an InGaN solar photovoltaic device with a flexible multi-layer structure and a method for manufacturing the same. The InGaN solar photovoltaic device with a flexible multi-layer structure can achieve a conversion efficiency close to the theoretically highest conversion efficiency of a solar beam, a significant improvement to the solar photovoltaic power generation efficiency as compared with the solar photovoltaic device in the prior art. The solar photovoltaic device of the invention is one-sixth in terms of cost of the silicon-based solar power generation device in the prior art, simple in the manufacturing process, easy to implement, suitable for large-scale popularization and application, and shows a promising prospect in applications in aerospace and other special fields.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, embodiments of the present invention will be described in detail. It should be noted that the following description is exemplary only and is not intended to limit the scope of the invention and its application.

It should be noted that an element, when referred to as being "fixed to" or "disposed on" another element, can be directly or indirectly on the other element. An element, when referred to as being "connected with" another element, can be directly or indirectly connected with the other element. In addition, connections may be used for both fixation and circuit/signal communication.

It is to be understood that the terms such as "length", "width", "upper", "lower", "front", "rear", "left", "right", "vertical", "horizontal", "top", "bottom", "inner" and "outer" refer to orientations or positional relationships based on the accompanying drawings, intended merely to facilitate the description of the embodiments of the invention, rather than to indicate or imply that a device or element referred to herein must have a particular orientation or must be constructed and operated in a particular orientation, and thus should not be construed as limiting the invention.

Furthermore, the terms "first" and "second" are used for descriptive purposes only and are not to be construed as expressing or implying relative importance or implicitly indicate the number of technical features referred to. Thus, features defined with "first" and "second" may explicitly or implicitly include one or more such features. In the description of the embodiments of the invention, "plurality" means two or more, unless specifically defined otherwise.

Figure 1:
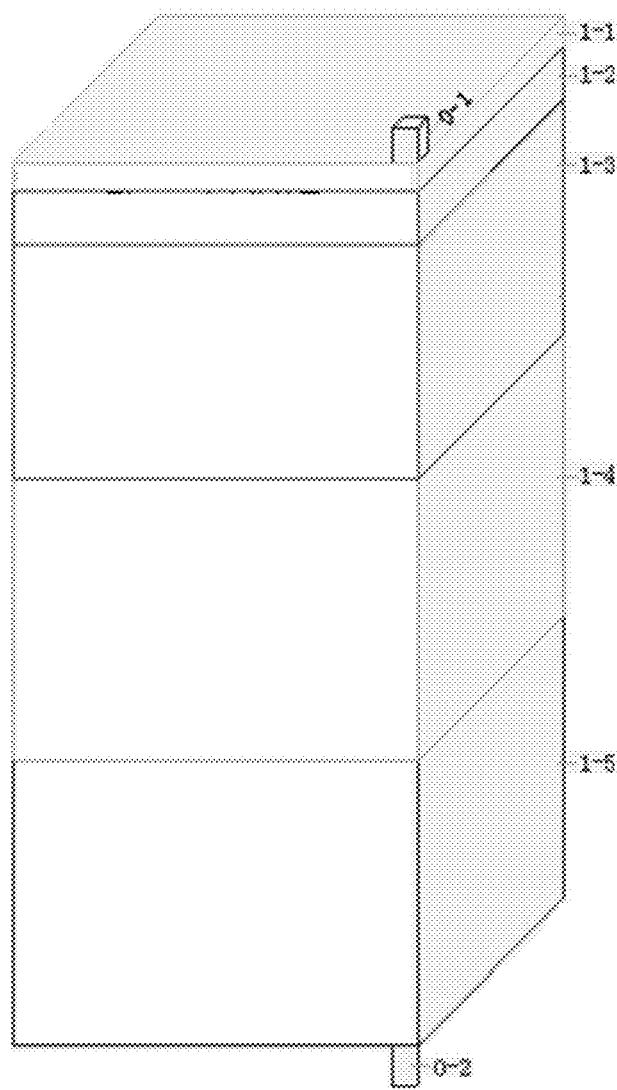
FIG. 1 is a schematic structural diagram of one embodiment of an InGaN solar photovoltaic device with a flexible multi-layer structure according to the present invention.
Figure 2:
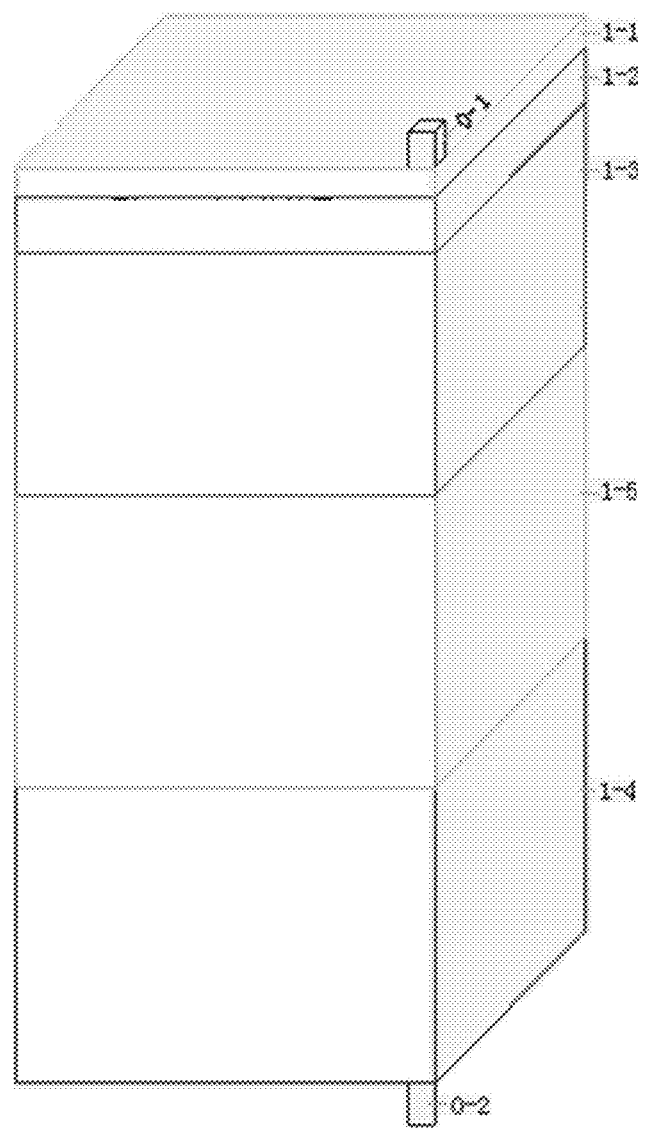
FIG. 2 is a schematic structural diagram of another embodiment of the InGaN solar photovoltaic device with a flexible multi-layer structure of the present invention.

Referring to FIGS. 1 and 2, in one embodiment, an InGaN solar photovoltaic device with a flexible multi-layer structure includes a base band 1-4 (or substrate), a light absorption layer 1-3, an n-type ZnO electron transport layer 1-5, and a p-type InN hole transport layer 1-2 on a front side of the light absorption layer 1-3, the base band 1-4 and the n-type ZnO electron transport layer 1-5 are on a back side of the light absorption layer 1-3, wherein the light absorption layer 1-3 includes a p-type $In_xGa_{1-x}N$ layer and an n-type $In_yGa_{1-y}N$ layer which are superposed, where $0.2<x<0.4$, $0.2<y<0.4$, and the p-type $In_xGa_{1-x}N$ layer and the n-type $In_yGa_{1-y}N$ layer are doped with Si and Mg. In one embodiment, the p-type $In_xGa_{1-x}N$ layer is adjacent to the p-type InN hole transport layer 1-2.

In a preferred embodiment, the p-type $In_xGa_{1-x}N$ layer and n-type $In_yGa_{1-y}N$ layer which are superposed have a thickness of not less than 800 nm.

In a preferred embodiment, each of the p-type $In_xGa_{1-x}N$ layer and the n-type $In_yGa_{1-y}N$ layer each has a thickness of 400 nm.

In a preferred embodiment, the p-type InN hole transport layer 1-2 has a thickness of 20 nm and a hole concentration of $4\times10^{18}$ cm$^{-3}$, the base band 1-4 has a thickness of 15 µm, and the n-type ZnO layer electron transport layer 1-5 has a thickness of 15 µm and an electron concentration of $8\times10^{18}$ cm$^{-3}$.

In the embodiment shown in FIG. 1, the base band 1-4 is between the n-type ZnO electron transport layer 1-5 and the light absorption layer 1-3.

In the embodiment shown in FIG. 2, the n-type ZnO electron transport layer 1-5 is between the base band 1-4 and the light absorption layer 1-3.

In a preferred embodiment, the InGaN solar photovoltaic device with a flexible multi-layer structure further includes an anti-reflective layer 1-1 on a front side of the p-type InN hole transport layer 1-3.

In a preferred embodiment, the base band 1-4 is a quantum carbon base band, preferably a graphene quantum carbon compound semiconductor. Preferably, the graphene quantum carbon compound semiconductor disclosed in patent No. CN 106829930 B owned by the applicant can be used.

Referring to FIG. 1, in another embodiment, a method for manufacturing the InGaN solar photovoltaic device with a flexible multi-layer structure includes: forming a quantum carbon compound base band 1-4; growing, on a front side of a quantum carbon compound baseband, a light absorption layer 1-3 formed by superposing a p-type $In_xGa_{1-x}N$ layer/ an n-type $In_yGa_{1-y}N$ layer, wherein the p-type $In_xGa_{1-x}N$ layer/the n-type $In_yGa_{1-y}N$ layer is doped with Si and Mg; growing a p-type InN hole transport layer 1-2 on a front side of the light absorption layer; growing an n-type ZnO electron transport layer 1-5 on a back side of the quantum carbon compound baseband; and growing a front electrode 0-1 and a back electrode 1-1, respectively.

Referring to FIG. 2, in another embodiment, a method for manufacturing the InGaN solar photovoltaic power generation device with a flexible multi-layer structure includes: forming a quantum carbon compound base band 1-4; growing an n-type ZnO electron transport layer 1-5 on a front side of the quantum carbon compound baseband; growing, on a front side of the n-type ZnO electron transport layer 1-5, a light absorption layer 1-3 formed by superposing a p-type $In_xGa_{1-x}N$ layer/an n-type $In_yGa_{1-y}N$ layer, wherein the p-type $In_xGa_{1-x}N$ layer/the n-type $In_yGa_{1-y}N$ layer is doped with Si and Mg; growing a p-type InN hole transport layer 1-2 on a front side of the light absorption layer; and growing a front electrode 0-1 and a back electrode 1-1, respectively.

According to the aforementioned embodiments of the method for manufacturing, in a further preferred embodiment, the p-type $In_xGa_{1-x}N$ layer and the n-type $In_yGa_{1-y}N$ layer are deposited through a MoCVD process featuring a vacuum degree of $3\times10^{-4}$ Pa, a revolving speed of 32 Hz, an $NH_3$ flow rate of 52 sccm, an operating pressure of 5.6 Tor, and are grown sequentially with Ga followed by In, where a Ga source is trimethylgallium (TmGa), an In source is trimethylindium (TmIn), an N source is ammonia gas ($NH_3$); when Ga is grown, the Ga source has a temperature of 23° C., a carrier gas $H_2$ has a flow rate 16 sccm, and the deposition on the base band lasts for 30-40 min at 800° C.; when In is grown, the In source has a temperature of 20° C., the carrier gas $H_2$ has a flow rate of 26 sccm, and the deposition on the base band lasts for 80-90 min at 600° C.; the Si dopant is sourced from silane, a carrier gas $H_2$ has a flow rate of 10-14 sccm, the deposition lasts for 40-60 min; the Mg dopant is sourced from magnesium dimocene, a carrier gas $H_2$ has a flow rate of 20-28 sccm, and the deposition lasts for 20-40 min.

According to the aforementioned embodiments of the method for manufacturing, in a further preferred embodiment, the method further includes generating, on a front side of the p-type InN hole transport layer, an anti-reflective layer, where an electrode is grown.

The thin-film solar photovoltaic power generation device with a flexible multi-layer structure of the embodiment of the invention can reach a conversion efficiency of 72%, namely, the theoretical conversion efficiency for solar beams, while the solar conversion efficiency for the p-type $In_xGa_{1-x}N$ and n-type $In_yGa_{1-y}N$ dual junction devices is 36.6% and 41.3%, respectively. The embodiment of the invention can achieve the highest possible solar photovoltaic power generation efficiency now. The solar photovoltaic device of the invention is one-sixth in terms of cost of the silicon-based solar power generation device in the prior art, simple in the manufacturing process, easy to implement, and shows a promising prospect especially in applications in aerospace and other special fields.

Embodiments of the invention are further described below with reference to the accompanying drawings.

The light absorption layer of the InGaN solar photovoltaic power generation device with a flexible multi-layer structure of an embodiment includes a P-type $In_xGa_{1-x}N$ layer and an n-type $In_yGa_{1-y}N$ layer which are superposed, where $2<x<0.4, 0.2<y<0.4$, and has a thickness of not less than 800 nm. A p-type InN hole transport layer is grown on the light absorption layer with a hole concentration of $4\times10^{18}$ cm$^{-3}$ and a thickness of 20 nm. An n-type ZnO electron transport layer is grown on a back side of the light absorption layer with an electron concentration of $8\times10^{18}$ cm$^{-3}$ and a thickness of 15 micrometers. Finally, an electrode is grown on the p-type InN hole transport layer, and an electrode is grown under the n-type ZnO electron transport layer. Therefore, the core structure of the thin-film solar photovoltaic power generation device with the flexible multi-layer structure is formed. The p-type indium nitride InN hole transport layer is manufactured on a front side, and the n-type ZnO electron transport layer is manufactured on a back side of the light absorption layer. The p-type $In_xGa_{1-x}N$ layer and the n-type $In_yGa_{1-y}N$ layer are doped with Si and Mg, thereby forming a good internal electric field for the p-type and the n-type. An ZnO zinc oxide layer is used as the electron transport layer, ZnO has a lattice constant of 3.2495 Å, which is close to the lattice constant of the P-type hole transport layer. As an n-type electron, ZnO has an affinity of 4.5 eV, which is greater than the affinity of a GaN electron (4 eV), as a result, the InGaN light absorption layer has a small interfacial barrier, beneficial to the absorption of photo-induced electrons transported to the n-type layer.

In a preferred embodiment, the n-type ZnO electron transport layer on the back side of the quantum carbon base band employs MoCVD or atomic layer deposition (ALD) to grow a ZnO film. The n-type ZnO electron transport layer is favorable for conveying photoelectric carriers generated on the light absorption layer to the electrodes at the two ends and reducing the electron transport barrier. ZnO is used as the material for the n-type and has an electron affinity (4.5 eV) higher than that of GaN (4 eV), and a lattice constant of 3.2495 Å, which is close to the lattice constant of InN (3.189 Å). Therefore, when the InGaN light absorption layer forms the interface barrier, ZnO forms a much lower interface barrier than GaN, which is more advantageous for the collection of photo-induced electrons transported to the n-type.

In a preferred embodiment, the P-type $In_xGa_{1-x}N$ and the n-type $In_yGa_{1-y}N$ of the light absorption layer are doped with Si and Mg. The Si dopant is sourced from silane, a carrier gas $H_2$ has a flow rate of 10-14 sccm, the deposition lasts for 40-60 min; the Mg dopant is sourced from magnesium dimocene, a carrier gas $H_2$ has a flow rate of 20-28 sccm, and the deposition lasts for 20-40 min.

In a preferred embodiment, the P-type $In_xGa_{1-x}N$ and the n-type $In_yGa_{1-y}N$ are deposited using MoCVD, featuring a vacuum degree of $3\times10^{-4}$ Pa, a revolving speed of 32 Hz, an $NH_3$ flow rate of 52 sccm, an operating pressure of 5.6 Tor, and are sequentially grown with Ga followed by In, where a Ga source is trimethylgallium (TmGa), an In source is trimethylindium (TmIn), an N source is ammonia gas ($NH_3$); when Ga is grown, the Ga source has a temperature of 23° C., a carrier gas $H_2$ has a flow rate 16 sccm, and the deposition on the base band lasts for 30-40 min at 800° C.; when In is grown, the In source has a temperature of 20° C., the carrier gas $H_2$ has a flow rate of 26 sccm, and the deposition on the base band lasts for 80-90 min at 600° C.

In a preferred embodiment, III-V nitride base bands and direct bandgap compound semiconductor base bands prepared based on the graphene quantum carbon compound semiconductor disclosed in the prior patents such as No. CN109776826B and No. CN 106829930B can be adopted as the quantum carbon base band. In one embodiment, the base band is a metal ternary nitride and an InGaN mischcrystal compound semiconductor. The p-type $In_xGa_{1-x}N$/n-type $In_yGa_{1-y}N$ having triple junctions, multiple junctions, multiple layers and junctions, more layers and junctions and the like can be grown on the base band.

In the embodiment shown in FIG. 1, the multi-layer structure includes the quantum carbon compound base band 1-4 with a thickness of 15 μm, the light absorption layer 1-3 formed by superposing the P-type $In_xGa_{1-x}N$/n-type $In_yGa_{1-y}N$ is provided on the front side of the quantum carbon compound base band 1-4, either of the P-type $In_xGa_{1-x}N$ and the n-type $In_yGa_{1-y}N$ is 400 nm after doping, and two or three or more junctions can be formed; after plasma surface-cleaning treatment on the front side of the light absorption layer 1-3, the p-type InN hole transport layer 1-2 is grown on the front side with an electron concentration of $4\times10^{18}$ $cm^{-3}$ and a thickness of 20 nm; the n-type ZnO layer electron transport layer 1-5 is grown on a back side of the quantum carbon compound base band 1-4 with an electron concentration of $8\times10^{18}$ $cm^{-3}$ and a thickness 15 μm; an electrode 0-2 is generated on a back side of the n-type ZnO electron transport layer 1-5; an anti-reflective layer 1-1 is formed on a front side of the p-type InN hole transport layer 1-2 with a thickness of 20 nm, and a p-type electrode 0-1 is formed on the anti-reflective layer. As such, an InGaN compound solar photovoltaic power generation device with a flexible multi-layer structure or battery with high conversion efficiency is obtained.

Compared with the InGaN solar photovoltaic power generation device in the prior art, the InGaN solar photovoltaic power generation device of the invention is higher in conversion efficiency, thinner and lighter, especially applicable to special fields such as aerospace and outer space, and has a broad prospect in application.

The section of background art herein may include background information regarding the problems in the prior art and the context against which the present invention is made, rather than a description of the prior art. Accordingly, nothing in the background art represents or implies the applicant's acknowledge of the prior art.

The foregoing is a further detailed description of the invention in connection with specific/preferred embodiments, and is not to be construed as limiting the invention to such embodiments. It will be apparent to those skilled in the art that various substitutions and modifications can be made to the described embodiments without departing from the spirit of the invention, and it is intended that such substitutions and modifications fall within the scope of the invention. In the specification, description with reference to the terms such as "one embodiment", "some embodiments", "preferred embodiments", "examples", "specific examples", or "some examples" indicates that a particular feature, structure, material, or characteristic described in connection with the embodiments or examples is included in at least one embodiment or example of the invention. In the specification, schematic expressions of the above terms are not necessarily directed to the same embodiment or example. Moreover, the particular features, structures, materials, or characteristics described herein may be combined in any one or more embodiments or examples as appropriate. In addition, various embodiments or examples described in this specification, as well as features of various embodiments or examples, may be combined or associated by those skilled in the art without departing from the scope of the invention. Although embodiments of the present invention and advantages thereof have been described in detail, it should be understood that various changes, substitutions and alterations can be made herein without departing from the scope of the invention as defined by the appended claims. In addition, the scope of the present invention is not intended to be limited to the particular embodiments of the process, machine, manufacture, composition of matter, means, method, and steps described herein. Those of ordinary skill in the art will readily appreciate that the above disclosure, process, machine, manufacture, composition of matter, means, method, or steps, presently existing or later to be developed, which perform substantially the same function or achieve substantially the same result as the corresponding embodiments described herein may be utilized. Accordingly, the present application is intended to embrace within its scope such process, machine, manufacture, composition of matter, means, method or steps.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An InGaN solar photovoltaic device with a flexible multi-layer structure, comprising a base band, a light absorption layer, an n-type ZnO electron transport layer, and a p-type InN hole transport layer, the p-type InN hole transport layer being on a front side of the light absorption layer, and the base band and the n-type ZnO electron transport layer being on a back side of the light absorption layer, wherein the light absorption layer includes a p-type $In_xGa_{1-x}N$ layer and an n-type $In_yGa_{1-y}N$ layer which are superposed, where $0.2<x<0.4$ and $0.2<y<0.4$, and the p-type $In_xGa_{1-x}N$ layer is doped with Mg, and the n-type $In_yGa_{1-y}N$ layer is doped with Si, thereby forming an internal electric field for the p-type $In_xGa_{1-x}N$ layer and the n-type $In_yGa_{1-y}N$ layer, wherein the base band is between the n-type ZnO electron transport layer and the light absorption layer, wherein each of the p-type $In_xGa_{1-x}N$ layer and the n-type $In_yGa_{1-y}N$ layer each has a thickness of 400 nm, wherein the p-type InN hole transport layer has a thickness of 20 nm and a hole concentration of $4\times10^{18}$ $cm^{-3}$, wherein the base band is a graphene quantum carbon compound semiconductor, the base band has a thickness of 15 μm, and the n-type ZnO layer electron transport layer has a thickness of 15 μm and an electron concentration of $8\times10^{18}$ $cm^{-3}$.

2. The InGaN solar photovoltaic device with a flexible multi-layer structure according to claim 1, further comprising an anti-reflective layer on a front side of the p-type InN hole transport layer.

* * * * *